(12) United States Patent
Yoo et al.

(10) Patent No.: US 7,943,492 B2
(45) Date of Patent: May 17, 2011

(54) METHOD OF FORMING NITRIDE FILM AND NITRIDE STRUCTURE

(75) Inventors: Jaeun Yoo, Gyunggi-Do (KR); Hyung Soo Ahn, Busan (KR); Min Yang, Busan (KR); Masayoshi Koike, Gyunggi-Do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 574 days.

(21) Appl. No.: 11/790,125

(22) Filed: Apr. 24, 2007

(65) Prior Publication Data
US 2007/0254445 A1 Nov. 1, 2007

(30) Foreign Application Priority Data
Apr. 27, 2006 (KR) .................. 10-2006-0038260

(51) Int. Cl.
*H01L 21/20* (2006.01)
(52) U.S. Cl. ............ 438/478; 257/E21.09; 257/E21.11; 117/88
(58) Field of Classification Search .................. 438/791, 438/46, 507, 483, 478; 257/E21.11, E21.109, 257/E21.106, E21.09; 117/84, 88
See application file for complete search history.

(56) References Cited

U.S. PATENT DOCUMENTS

| | | | | | |
|---|---|---|---|---|---|
| 3,933,538 | A | * | 1/1976 | Akai et al. | 117/57 |
| 5,923,054 | A | * | 7/1999 | Kobashi et al. | 257/103 |
| 6,218,269 | B1 | * | 4/2001 | Nikolaev et al. | 438/518 |
| 6,508,879 | B1 | * | 1/2003 | Hashimoto | 117/104 |
| 6,533,874 | B1 | * | 3/2003 | Vaudo et al. | 148/33.5 |
| 2002/0177312 | A1 | * | 11/2002 | Tsvetkov et al. | 438/689 |
| 2005/0077537 | A1 | * | 4/2005 | Seong et al. | 257/103 |
| 2005/0142391 | A1 | * | 6/2005 | Dmitriev et al. | 428/698 |
| 2005/0153471 | A1 | * | 7/2005 | Sasaki et al. | 438/29 |
| 2006/0071234 | A1 | * | 4/2006 | Irikura et al. | 257/103 |
| 2006/0273343 | A1 | * | 12/2006 | Nakahata et al. | 257/103 |
| 2006/0280668 | A1 | * | 12/2006 | Dmitriev et al. | 423/412 |
| 2007/0128753 | A1 | * | 6/2007 | Oshima | 438/46 |

(Continued)

FOREIGN PATENT DOCUMENTS
JP 08-335555 12/1996
(Continued)

OTHER PUBLICATIONS

Kim et al., Fabrication of SAG-AlGaN/InGaN/AlGaN LEDs by mixed source HVPE with multi-sliding boat system phys, stat. sol. (c) 4, No. 1, pp. 29-32 (2007). published online Jan. 11, 2007.*

(Continued)

*Primary Examiner* — Laura M Menz
*Assistant Examiner* — Latanya Crawford
(74) *Attorney, Agent, or Firm* — McDermott Will & Emery LLP

(57) ABSTRACT

A method of forming a nitride film by hydride vapor phase epitaxy, the method including: sequentially disposing at least one group III metal source including impurities and a substrate in an external reaction chamber and an internal reaction chamber sequentially located in the direction of gas supply and heating each of the external reaction chamber and the internal reaction chamber at a growth temperature; forming a metal chloride by supplying hydrogen chloride gas and carrier gas into the external reaction chamber to react with the group III metal source and transferring the metal chloride to the substrate; and forming the nitride film doped with the impurities on the substrate by reacting the transferred metal chloride with nitrogen source gas supplied to the internal reaction chamber.

8 Claims, 4 Drawing Sheets

U.S. PATENT DOCUMENTS

2008/0042160 A1* 2/2008 Shibata .......................... 257/103
2008/0083910 A1* 4/2008 Scholz et al. .............. 252/521.5
2008/0272463 A1* 11/2008 Butcher et al. ................ 257/615

FOREIGN PATENT DOCUMENTS

| JP | 2003-517721 | | 5/2003 |
| JP | 2004-193371 | | 7/2004 |
| KR | 2005-009340 A | * | 1/2005 |
| WO | WO 2005/008738 A2 | | 1/2005 |

OTHER PUBLICATIONS

R.G. Wilson et al., "Redistribution and activation of implanted S, Se, Te, Be, Mg, and C in GaN," J. Vac. Sci. Technol. A 17(4), Jul./Aug. 1999, 1999 American Vacuum Society, pp. 1226-1229.
Japanese Office Action, with English translation, issued in Japanese Patent Application No. 2007-119379, dated Mar. 30, 2010.

* cited by examiner

US 7,943,492 B2

METHOD OF FORMING NITRIDE FILM AND NITRIDE STRUCTURE

CLAIM OF PRIORITY

This application claims the benefit of Korean Patent Application No. 2006-0038260 filed on Apr. 27, 2006, in the Korean Intellectual Property Office, the disclosure of which is incorporated herein by reference.

BACKGROUND OF THE INVENTION

1. Field of the Invention

The present invention relates to a method of forming a nitride film, and more particularly, to a method of forming a nitride film including certain conductive type impurities such as n type impurities and a nitride structure formed by using the method.

2. Description of the Related Art

In general, group III nitride semiconductors may emit a broad spectrum of light covering not only an entire of visible light also ultra violet (UV) and have been in the lime light. To form light emitting diodes (LEDs) or provide a conductive substrate, it is required to group III nitride semiconductors to be formed to have a certain conductive type such as a p type and an n type and various methods have been employed. For example, an n type GaN is formed by using a metal organic chemical vapor deposition (MOCVD) method of supplying monosilane $SiH_4$ as n type impurities together with TMG and NH3 gas at the same time.

However, since an equilibrium vapor pressure of nitrogen is very high, a nitrogen atom may be departed from a crystal when a Ga atom is substituted with a group IV element such as a Si atom that is n type impurities. Accordingly, due to the departure of the nitrogen atom, a number of defects may increases and device characteristics may be deteriorated.

To solve the problem, a method of using a group VI element such as Te as n type impurities has been tried. In the MOCVD method or an MBE method, though diethylen-Te (DETe) may be used for a Te impurity source, doping is difficult and a residue exists in a reaction chamber, thereby causing a trouble in performing a next process.

Implantation techniques for ions by using high energy is introduced by "Redistribution and activation of implanted S, Se, Te, Be, Mg, and C in GaN" J. Vac. Sci. Tchnol. A. 17 (4), July/August 1999. However, referring to FIG. 1, implanted ions may be activated when heat-treated at a temperature of at least 1200° C. Furthermore, since a GaN crystal is deteriorated in a process of implanting ions by using high energy, a heat treatment process at a temperature more than 1400° C. is required.

SUMMARY OF THE INVENTION

An aspect of the present invention provides a method of forming a nitride film by using hydride vapor phase epitaxy (HVPE) combined with a new doping process capable of acquiring a high carrier density and electrical conductivity without restriction on characteristics of atoms of impurities.

An aspect of the present invention also provides a nitride structure having an enough thickness and high electrical conductivity.

According to an aspect of the present invention, there is provided a method of forming a nitride film by hydride vapor phase epitaxy, the method including: sequentially disposing at least one group III metal source including impurities and a substrate in an external reaction chamber and an internal reaction chamber sequentially located in the direction of gas supply and heating each of the external reaction chamber and the internal reaction chamber at a growth temperature; forming a metal chloride by supplying hydrogen chloride gas and carrier gas into the external reaction chamber to react with the group III metal source and transferring the metal chloride to the substrate; and forming the nitride film doped with the impurities on the substrate by reacting the transferred metal chloride with nitrogen source gas supplied to the internal reaction chamber.

A nitride doped with impurities, particularly, a nitride doped with impurities of a group VI element such as Te may be formed without a process of high temperature heat treatment and may generate no residue.

Embodiments of the present invention may be divided into different depending on a metal source including impurities.

According to an embodiment of the present invention, the at least one group III metal source may include the impurities. For example, the at least one group III metal source may be a Ga source including Te. In this case, the nitride film may be an n type GaN doped with Te. The at least one group III metal source may further include another metal source formed of at least one kind of a group III metal different from the group III single metal source. The another metal source may be one of at least one metal of Al and In and an alloy source of Al and In.

On the other hand, according to another embodiment of the present invention, the group III metal source may include an alloy source including the impurities and a plurality of kinds of group III metals. For example, the at least one group III metal source may be an Al—Ga alloy source including Te. In this case, the nitride film may be an n type AlGaN doped with Te. Also, the at least one group III metal source may further include another metal source formed of at least one kind of a group III metal different from a chemical element forming the alloy source.

The present invention may be effective when using a group VI metal for the impurities for forming the n type nitride film. For example, as the group VI metal impurities, one of Se and Te may be used.

A group IV metal may be used for the n type impurities, in addition to the group VI metal. For example, the group IV metal impurities may be one of Si, Ge, Sn, and Pb.

According to another aspect of the present invention, there is provided a nitride structure formed of a group III nitride film having a thickness of more than 5 μm, in which concentration of certain conductive type impurities is uniform lengthwise and $10^{16}$ to $10^{20}/cm^3$.

In addition, since the group III nitride structure can be grown at a relatively high speed by an HVPE process, the group III nitride structure may be a nitride film having a thickness more than 50 μm satisfying a thickness for a substrate.

According to an exemplary embodiment of the present invention, an n type nitride film doped with Te impurities to have concentration distributed uniformly in the direction of a thickness is provided.

Also, the nitride structure may have an electrical conductivity of at least $4 \times 10^2 \, (\Omega \, cm)^{-1}$. When the impurities is Te, the conductivity may be acquired by doping the Te impurities to have $2 \times 10^{18}$ to $10^{20}/cm^3$.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
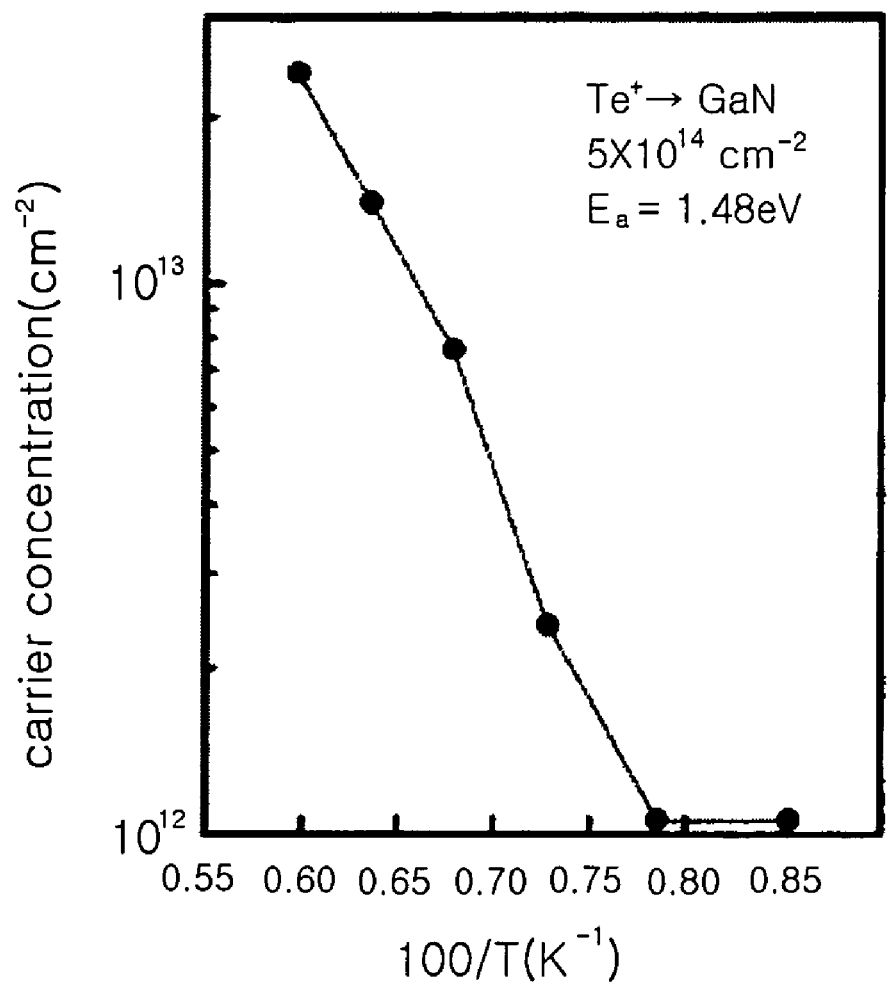
FIG. 1 is a graph illustrating Te concentration in a conventional n type nitride film formed by ion implantation, changed depending on a temperature of heat treatment.
Figure 2:
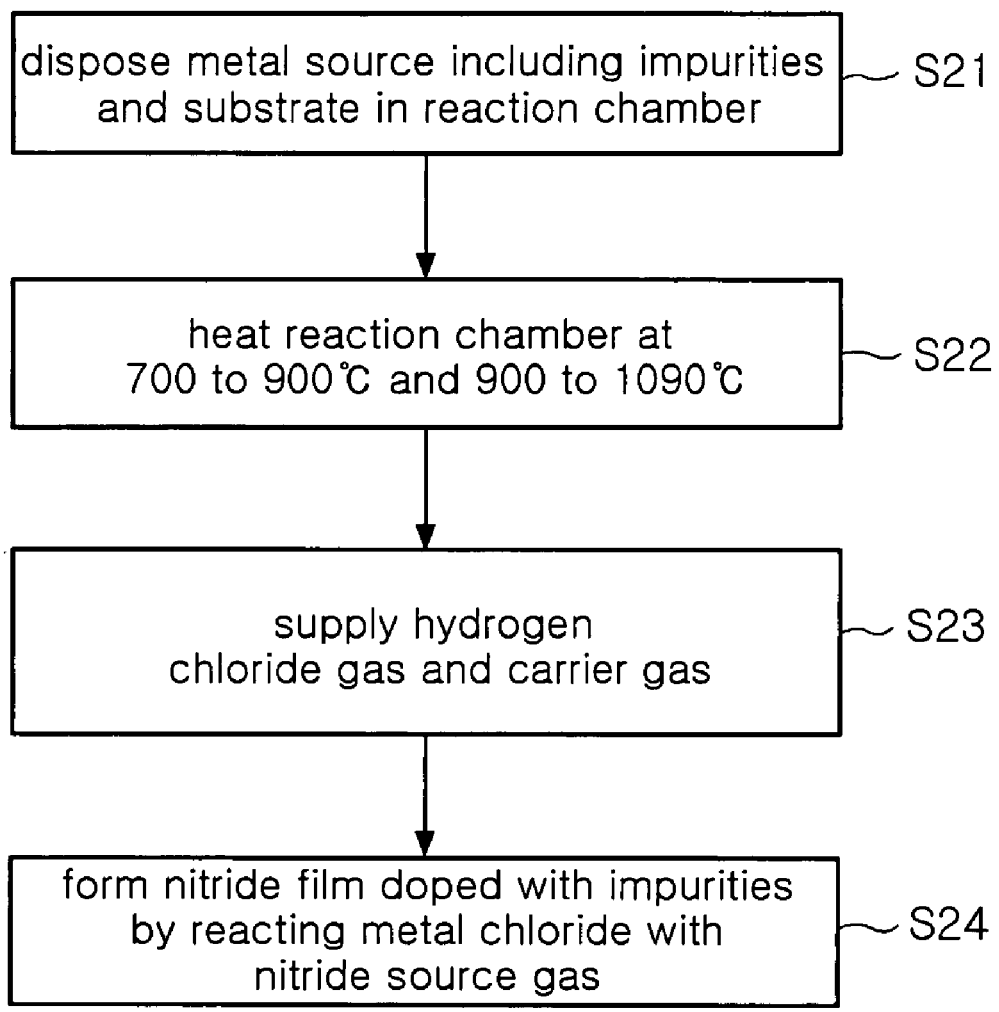
FIG. 2 is a flowchart illustrating a method of forming a nitride film, according to an exemplary embodiment of the present invention.

FIG. 2 is a flowchart illustrating a method of forming a nitride film by using an HVPE process. Referring to FIG. 2, at least one group III metal source and a substrate are disposed in a HVPE reaction chamber, respectively (in operation S21). Generally, the at least one group III metal source and the substrate are sequentially disposed according to a direction of gas supply.

According to an exemplary embodiment of the present invention, a group III metal source may be an alloy added with a small amount of desired impurities. A metal source for forming an n type nitride film may be an alloy of a group III metal and one of a group IV element and group VI element as impurities. For example, to form an n type GaN doped with Te, a Ga source added with a small amount of Te is used for a metal source. In this case, an amount of one of the group IV element and the group VI element may be controlled according to doping concentration.

Though sapphire is mainly used for the substrate, the substrate may be formed of a material of one of SiC, Si, $MgAl_2O_4$, MgO, $LiAlO_2$, and $LiGaO_2$.

In operation S22, the reaction chamber in which the at least one group III metal source including the impurities and the substrate are disposed is heated at a temperature required for reaction. Generally, the group III metal source is heated at a temperature of approximately 700 to 900° C. for a reaction of generating a chloride and the substrate is heated at a temperature of approximately 900 to 1090° C. for a reaction for nitride growth.

In operation S23, hydrogen chloride gas and a carrier gas are supplied to the group III metal source. The hydrogen chloride gas reacts with the group III metal source and a group III metal chloride is formed. In this case, the impurities included in the metal source forms a certain chloride via a reaction according to the kind of the impurities.

For example, in the case of group IV impurities such as Si, Si may be substituted for a portion of Ga, namely, a metal chloride may be formed as (Ga, Si)Cl. However, in the case of group VI impurities, a process of a reaction has been not clearly defined. Only, the present inventor may estimate the process of the reaction as two types. For example, Ga source added with Te may be provided in the form of (Ga, Te)Cl, similar to the case of Si, and may form a chloride of $TeCl_n$ in addition to GaCl.

Also, the carrier gas transferring the chloride generated together with the hydrogen chloride gas to the substrate is supplied. An inactive gas such as nitrogen gas and argon gas may be used for the carrier gas.

In operation S24, a nitride film doped with the impurities is formed on the substrate by reacting a nitrogen source gas with the transferred metal chloride. $NH_3$ gas may be used for the nitrogen source gas. A desired nitride film is grown on the substrate by reacting $NH_3$ gas with the transferred metal chloride at a high temperature. In the process of growth of the nitride film, the chloride including impurities may be uniformly added into the nitride film by reacting with $NH_3$ gas.

The embodiment of the present invention may be used as an alloy made by adding desired impurities into a metal source used in an HVPE process. Impurities capable of being used are not limited to a certain conductive type. Particularly, the embodiment of the present invention may be very effect when growing a nitride doped with group VI element impurities such as Te. Namely, according to an exemplary embodiment of the present invention, different from a conventional ion implantation process, the nitride film may be formed without deterioration of crystal and high temperature heat treatment for activation and uniform doping concentration may be distributed in an entire thickness. In addition, a problem of residue due to a DETe source, caused in a conventional process of forming a nitride film by using a MOCVD method, may be solved.

The embodiment of the present invention may be very effectively applied when using a group VI element metal as impurities for forming an n type nitride film. For example, at least one of Se and Te may be used for the group VI element metal impurities. However, the present invention is not limited to the group VI element metal impurities and other n type impurities such as a group IV element metal may be used. For example, the group IV element metal impurities may be at least one of Si, Ge, Sn, and Pb.

Figure 3:
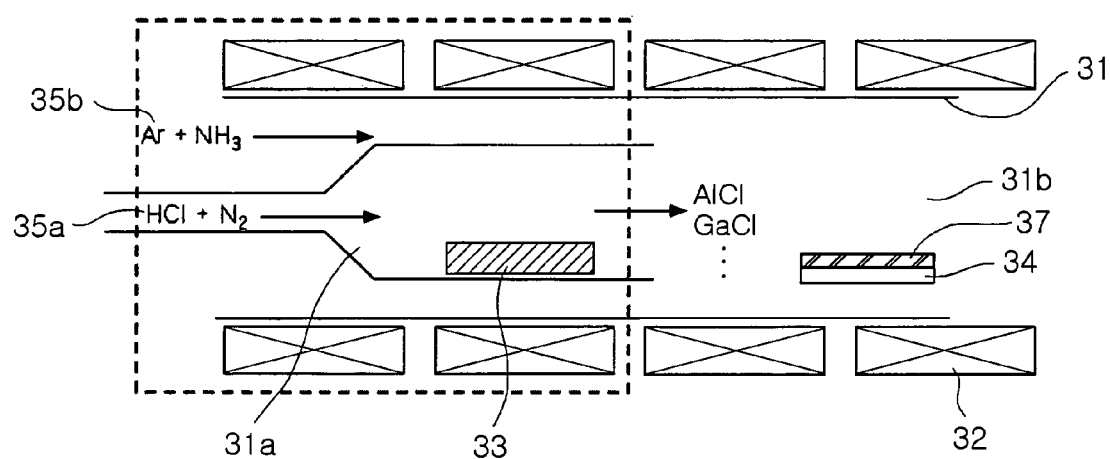
FIG. 3 is a cross-sectional view illustrating an HVPE apparatus capable of being employed by the method of forming a nitride film.

FIG. 3 is a cross-sectional view illustrating an HVPE apparatus 30 capable of being employed to the nitride film forming method according to an exemplary embodiment of the present invention. Referring to FIG. 3, the HVPE apparatus 30 includes a reaction chamber 31 divided into an external reaction chamber 31a and internal reaction chamber 31b, sequentially located from the direction of gas supply, and a heater installed around the reaction chamber 31. At least one group III metal source 33 including impurities is disposed in the external reaction chamber 31a, and a substrate 34 is disposed in the internal reaction chamber 31b.

As described above, a metal chloride for growing a nitride film 37 may be generated and the metal chloride may be transferred to the substrate 34 by supplying hydrogen chloride gas and an inactive carrier gas such as $N_2$ and Ar to the group III metal source 33 in the external reaction chamber 31a via a first pipeline 35a. In this case, the metal chloride includes chlorides including various forms of impurities in addition to the group III metal chloride. On the other hand, the nitride film 37 doped with impurities is formed on the substrate 35 by reacting the metal chloride transferred to the substrate 35 in the internal reaction chamber 31b with a nitride source gas such as $NH_3$.

In this case, though the HVPE apparatus has a form including a horizontal path of a reaction chamber and gas, as obvious to those skilled in the art, a HVPE apparatus having a form including a vertical path may be used.

The metal source 33 including impurities may be embodied in various forms. According to an embodiment of the present invention, a group III single metal source including impurities may be used. For example, the group III metal source may be a Ga source including Te. Also, in this case, an n type GaN doped with Te may be grown on the substrate 34. When forming one of a group III compound semiconductor and a group IV compound semiconductor such as AlGaN and AlGaInP, another group III metal source such as In may be further disposed in addition to the group III single metal source doped with impurities.

On the other hand, the group III metal source may be an alloy source formed of a plurality of types of group III metals including the impurity metal. For example, the group III metal source may be an Al—Ga alloy source including Te. In this case, an n type AlGaN doped with Te may be grown on the substrate 34. In the present embodiment, a nitride satisfying a desired composition formula may be acquired by controlling a atomic fraction of Al and Ga in the alloy, without flow control with respect to two or more metal sources.

In the method of forming a nitride film according to an exemplary embodiment of the present invention, impurities difficult to be doped may be easily doped to the nitride film, without deterioration of crystal and additional heat treatment. Particularly, doping concentration of the nitride film may be controlled to be relatively accurate by controlling an amount of impurities included in a metal source.

Hereinafter, effects of the present invention will be described in detail referring to an exemplary embodiment of the present invention.

EXAMPLE

An alloy source of the present example was formed of Al and Ga, including a small amount of desired Te by fusing Al and Te into Ga metal and saturated at a temperature of 900° C. In the present example, seven alloy sources whose atomic fractions were 0.003, 0.008, 0.012, 0.016, 0.018, 0.035, and 0.043, respectively, under a condition of maintaining a ratio of an amount of Al to a total amount of Al and Ga as 16% were used.

A sapphire substrate on which an undoped GaN had been formed was cleaned by using an ultrasonic cleaner using solutions of acetone and methanol and etched in a solution of hafnium for one minute to remove an oxide film. The sapphire substrate and the alloy source were disposed in a reaction chamber, respectively.

The reaction chamber was heated to a 1090° C. that was a crystal growth temperature, 20 sccm of HCl and 500 sccm of ammonia were supplied to the reaction chamber, and $Al_{0.16}Ga_{0.84}N$ doped with Te was grown for approximately 40 minutes. Under the same condition, additional six $Al_{0.16}Ga_{0.84}N$ doped with Te were formed by using six alloy sources having other atomic fractions of Te.

Figure 4:
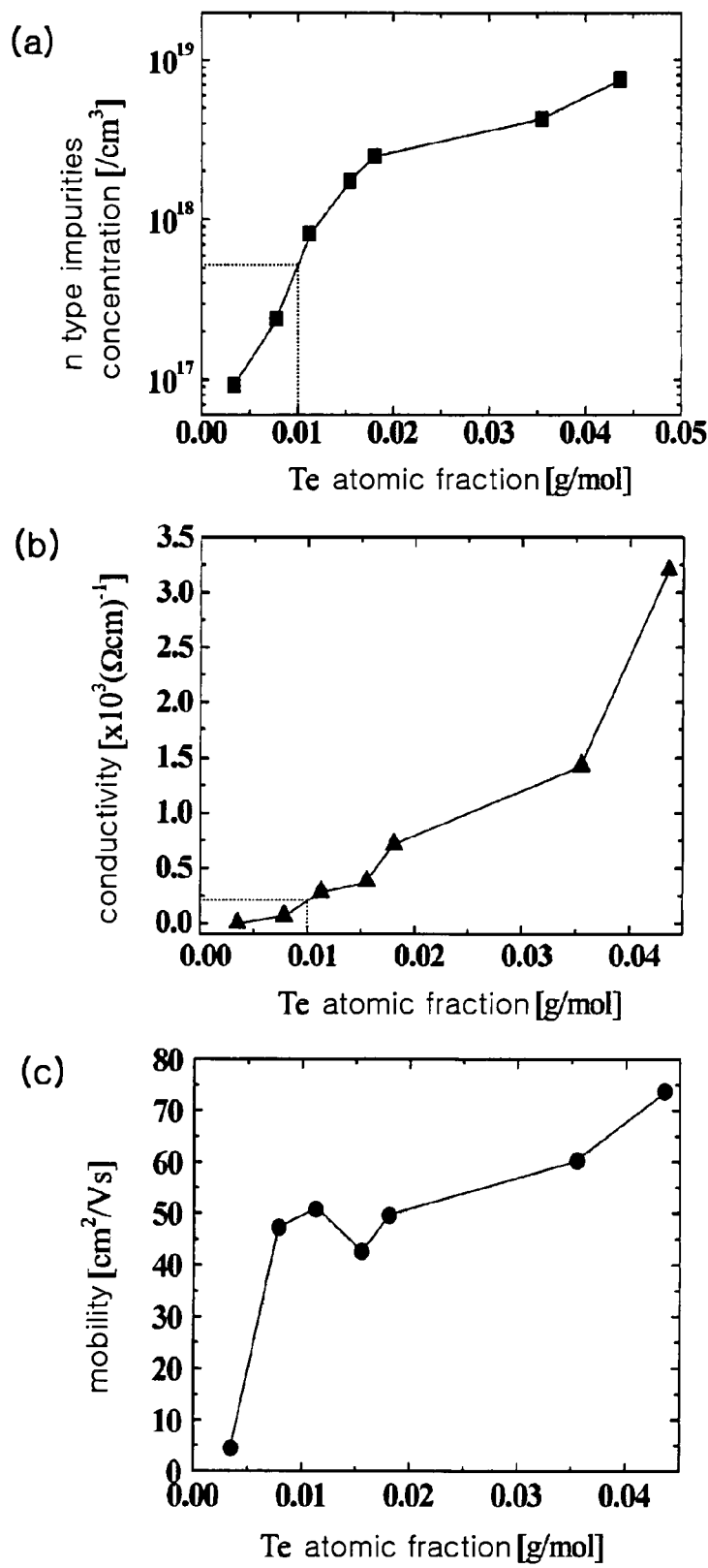
FIG. 4A is a graph illustrating concentration of Te impurities in a nitride film formed by the method according to an exemplary embodiment of the present invention.
FIG. 4B is a graph illustrating conductivity of the nitride film formed by the method according to an exemplary embodiment of the present invention.
FIG. 4C is a graph illustrating carrier mobility of the nitride film formed by the method according to an exemplary embodiment of the present invention.

FIGS. 4A through 4C are graphs illustrating concentration of a carrier, electrical conductivity, and carrier mobility of the $Al_{0.16}Ga_{0.84}N$ doped with Te formed in the present example. Referring to FIG. 4A, as atomic fraction of Te in the alloy source increased from 0.003 to 0.045, concentration of the carrier increased from $9 \times 10^{16}$ to $7 \times 10^{19}$. Referring to FIG. 4B, the electrical conductivity also increased from when the atomic fraction of Te was 0.01 and had a high conductivity of $3.25 \times 10^3$ $(\Omega\text{ cm})^{-1}$ when the atomic fraction of Te was 0.045. Referring to FIG. 4C, the carrier mobility was also maintained at a high level when the atomic fraction of Te was more than 0.01.

As described above, a nitride film having excellent conductivity may be grown by using the metal source doped with impurities according to the example of the present invention. Also, a nitride film having excellent n type characteristics may be acquired when atomic fraction of Te was 0.01 or more.

In addition, in a similar experiment with respect to Si, doping concentration was $2 \times 10^{16}$ to $3 \times 10^{17}/\text{cm}^3$ when atomic fraction of Si was changed from 0.102 to 0.218 g/mol.

Since the method of forming a nitride film according to the example of the present invention employs the HVPE process, the nitride doped with impurities whose thickness is difficult to be acquired from one of MOCVD and MBE processes may be formed. Particularly, an n type nitride substrate available for a free standing substrate may be formed by using the method. Also, though a thick nitride film is formed by using the HVPE process, different from conventional methods of doping impurities via ion implantation and heat treatment, a nitride film in which impurities of a certain conductive type are uniformly distributed in the direction of thickness may be formed.

Accordingly, according to another aspect of the present invention, there is provided a group III nitride structure having a thickness of more than 5 μm, in which concentration of certain conductive type impurities is uniform lengthwise and $10^{16}$ to $10^{20}/\text{cm}^3$. The group III nitride structure may be a nitride film having a thickness more than 50 μm to be used for a substrate.

As described above, according to an exemplary embodiment of the present invention, an n type nitride substrate doped with Te, whose doping process is difficult, may be formed and may have high conductivity. The nitride structure according to an exemplary embodiment of the present invention may have electrical conductivity of at least $4 \times 10^2$ $(\Omega\text{ cm})^{-1}$. The electrical conductivity may be acquired by doping Te to have concentration of $2 \times 10^2$ to $10^{20}/\text{cm}^3$.

As described above, according to an exemplary embodiment of the present invention, there is provided a method of forming a nitride film not limited to characteristics of elements of impurities and acquiring improved carrier density and electrical conductivity by adding a small amount of elements of impurities required to give a conductive type to one of a group III metal source or an alloy source used in an HVPE process.

According to an exemplary embodiment of the present invention, additional heat treatment is not required, a residue is not generated, and a growth process is performed together with the method, thereby largely improving process efficiency. Particularly, since the HVPE process advantageous for a thick film process is employed, a thick film such as an n type conductive nitride substrate having doping concentration uniform in the direction of a thickness and excellent conductivity may be formed.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of forming a nitride film by hydride vapor phase epitaxy process, the method comprising:
   sequentially disposing at least one group III metal source including impurities and a substrate in an external reaction chamber and an internal reaction chamber sequentially located in the direction of gas supply and heating each of the external reaction chamber and the internal reaction chamber at a growth temperature;

forming a metal chloride by supplying hydrogen chloride gas and carrier gas into the external reaction chamber to react with the group III metal source and transferring the metal chloride to the substrate; and forming the nitride film doped with the impurities on the substrate by reacting the transferred metal chloride with nitrogen source gas supplied to the internal reaction chamber, wherein the impurities comprise Te and the nitride film is an n type nitride film and wherein the atomic fraction of Te is more than 0.01 g/mol and the concentration of n type impurities within the nitride film is more than $5 \times 10^{17}/cm^3$.

2. The method of claim 1, wherein the at least one group III metal source comprises a group III single metal source including the impurities.

3. The method of claim 1, wherein the at least one group III metal source comprises a Ga source including Te and the nitride film comprises an n type GaN doped with Te.

4. The method of claim 1, wherein the at least one group III metal source further comprises another metal source formed of at least one kind of a group III metal different from the group III single metal source.

5. The method of claim 1,
wherein the group III metal source comprises an alloy source including the impurities and a plurality of kinds of group III metals.

6. The method of claim 4, wherein the another metal source comprises one selected from a group consisting of at least one metal of Al and In and an alloy source of Al and In.

7. The method of claim 5, wherein the at least one group III metal source comprises an Al—Ga alloy source including Te and the nitride film comprises an n type AlGaN doped with Te.

8. The method of claim 7, wherein the another metal source comprises In.

* * * * *